(12) United States Patent
Danno et al.

(10) Patent No.: US 9,190,482 B2
(45) Date of Patent: Nov. 17, 2015

(54) METHOD OF PRODUCTION OF SIC SEMICONDUCTOR DEVICE

(75) Inventors: Katsunori Danno, Susono (JP);
Tsunenobu Kimoto, Kyoto (JP)

(73) Assignees: Toyota Jidosha Kabushiki Kaisha,
Toyota-shi, Aichi-ken (JP); Kyoto University, Kyoto (JP)

( * ) Notice: Subject to any disclaimer, the term of this patent is extended or adjusted under 35 U.S.C. 154(b) by 77 days.

(21) Appl. No.: 13/599,010

(22) Filed: Aug. 30, 2012

(65) Prior Publication Data

US 2013/0059429 A1     Mar. 7, 2013

(30) Foreign Application Priority Data

Sep. 7, 2011   (JP) ................................. 2011-195010
Aug. 13, 2012  (JP) ................................. 2012-179268

(51) Int. Cl.
*H01L 29/66* (2006.01)
*H01L 21/04* (2006.01)

(52) U.S. Cl.
CPC ...... *H01L 29/66068* (2013.01); *H01L 21/0485* (2013.01)

(58) Field of Classification Search
CPC .................................................. H01L 21/0445
USPC ............ 257/77, E21.575, E29.104, 329, 288, 257/E21.066, E29.262, 473; 438/514, 602
See application file for complete search history.

(56) References Cited

U.S. PATENT DOCUMENTS

| | | | | |
|---|---|---|---|---|
| 4,963,509 A | * | 10/1990 | Yoshizawa et al. | 438/543 |
| 5,674,765 A | * | 10/1997 | Rottner et al. | 438/506 |
| 5,710,059 A | * | 1/1998 | Rottner | 438/547 |
| 5,729,043 A | * | 3/1998 | Shepard | 257/519 |
| 5,750,434 A | * | 5/1998 | Urushidani et al. | 438/478 |
| 6,096,627 A | * | 8/2000 | Harris et al. | 438/520 |
| 6,573,534 B1 | * | 6/2003 | Kumar et al. | 257/77 |
| 8,368,165 B2 | * | 2/2013 | Richieri | 257/473 |
| 2004/0092084 A1 | * | 5/2004 | Rayssac | 438/455 |
| 2005/0173739 A1 | * | 8/2005 | Kusumoto et al. | 257/263 |
| 2005/0227422 A1 | * | 10/2005 | Nakamura et al. | 438/166 |
| 2006/0208261 A1 | * | 9/2006 | Kaneko et al. | 257/77 |
| 2007/0090481 A1 | * | 4/2007 | Richieri | 257/473 |

(Continued)

FOREIGN PATENT DOCUMENTS

JP    2007214355 A  *  8/2007
JP    2009-231430 A     10/2009

(Continued)

OTHER PUBLICATIONS

Y. Vodakov et al., "Diffusion and Solubility of Impurities in Silicon Carbide," Silicon Carbide, R.C. Marshall, et al., eds., Univ. of South Carolina Press, pp. 508-519 (1973).

*Primary Examiner* — Yu-Hsi D Sun
*Assistant Examiner* — Ankush Singal
(74) *Attorney, Agent, or Firm* — Finnegan, Henderson, Farabow, Garrett & Dunner, LLP

(57) ABSTRACT

A method of production of an SiC semiconductor device, which can form an ohmic electrode while preventing electrode metal from diffusing in the SiC single crystal substrate, includes a step of forming an ohmic electrode on an SiC substrate, characterized by forming a gettering layer with a defect density higher than the SiC substrate on that substrate to be parallel with the substrate surface, then forming the ohmic electrode the gettering layer outward from the substrate.

3 Claims, 4 Drawing Sheets

(56) References Cited

U.S. PATENT DOCUMENTS

| | | | |
|---|---|---|---|
| 2008/0026544 A1* | 1/2008 | Tsuchida et al. | 438/471 |
| 2009/0101918 A1* | 4/2009 | Uchida et al. | 257/77 |
| 2009/0209090 A1* | 8/2009 | Yokoyama et al. | 438/476 |
| 2009/0243026 A1* | 10/2009 | Nakamura et al. | 257/471 |
| 2009/0250705 A1* | 10/2009 | Watanabe et al. | 257/77 |
| 2009/0278169 A1* | 11/2009 | Hayashi et al. | 257/183 |
| 2010/0102332 A1* | 4/2010 | Takahashi et al. | 257/77 |
| 2010/0295062 A1* | 11/2010 | Uchida et al. | 257/77 |
| 2011/0053350 A1 | 3/2011 | Watanabe et al. | |
| 2011/0309376 A1* | 12/2011 | Hiyoshi et al. | 257/77 |
| 2012/0007104 A1* | 1/2012 | Wada et al. | 257/77 |
| 2013/0244407 A1* | 9/2013 | Yokoyama et al. | 438/478 |

FOREIGN PATENT DOCUMENTS

| | | |
|---|---|---|
| JP | 2012-243812 A | 12/2012 |
| WO | WO 2012/156792 A1 | 11/2012 |

\* cited by examiner

FIG.1A
(PRIOR ART)
FIG.1B
(1) 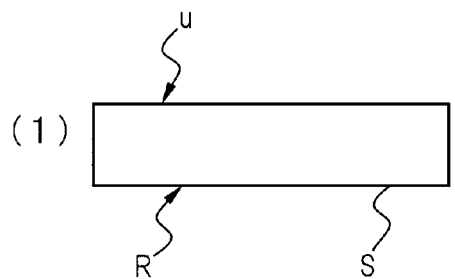
(1) 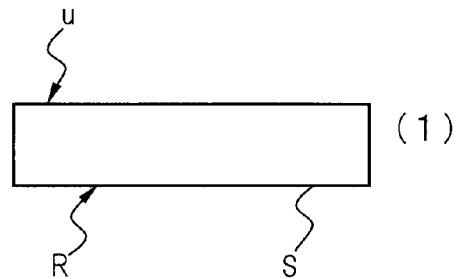
(2) 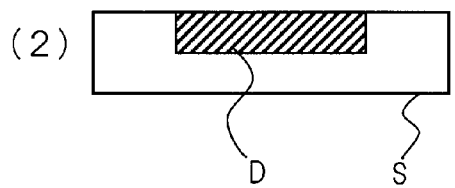
(2) 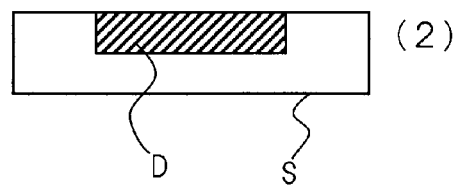
(3) 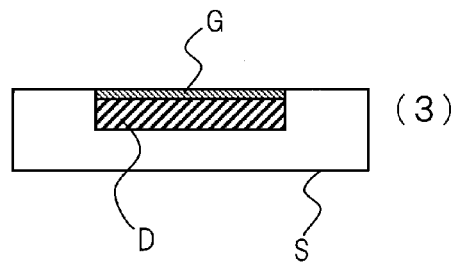
(3) 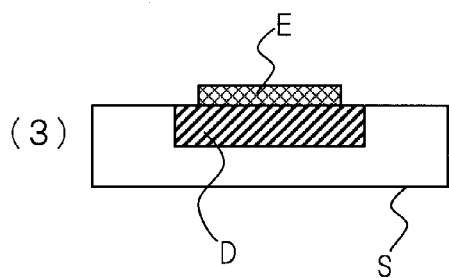
(4) 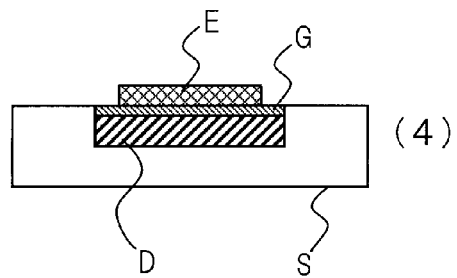

METHOD OF PRODUCTION OF SIC SEMICONDUCTOR DEVICE

CROSS-REFERENCE TO RELATED APPLICATIONS

This application claims the priority of Japanese Application Nos. 2011-195010, filed Sep. 7, 2011, and 2012-179268, filed Aug. 13, 2012, the content of both of which is incorporated herein by reference.

TECHNICAL FIELD

The present invention relates to a method of production of an SiC (silicon carbide) semiconductor device, more particularly relates to a method of production of an SiC semiconductor device which prevents diffusion of an electrode metal inside of an SiC single crystal substrate at the time of formation of an ohmic electrode.

BACKGROUND ART

In the past, in Si and other semiconductor crystals, the practice has been to prevent the drop in device characteristics due to metal impurities by using ion implantation, laser irradiation, formation of a film of different materials, etc. to form strain regions and thereby form gettering sites of impurities.

As opposed to this, in the case of an SiC crystal, the coefficient of diffusion of impurities is extremely small, so at the heat treatment temperature (at the maximum, 1200° C. or so) which is normally used with Si crystals, it has been believed that heat diffusion substantially does not occur (NPLT 1). For this reason, the art of gettering of SiC has not been considered much at all.

When forming an ohmic electrode at an SiC semiconductor device, it is necessary to form an n+ layer at the surface of the SiC substrate, use vapor deposition or sputtering etc. to form a metal film for electrode use, then perform heat treatment (800 to 1000° C. or so) for alloying. This heat treatment is performed for alloying the SiC surface and lowering the φs for achieving the ohmic contact conditions of the electrode ($\phi m < \phi s$:$\phi m$=work function of metal, $\phi$=work function of semiconductor). Further, this is sometimes performed for adjusting the barrier height of a Schottky contact.

That is, it is essential to form a reaction layer of the electrode metal and SiC (alloyed layer), but the inventors newly discovered that through the formation of this reaction layer, the electrode metal diffuses into the SiC crystal. The metal, in particular a transition metal, among these Ni with the largest atomic number etc., freely diffuses in the SiC crystal. In particular, they newly discovered the problem that when forming a high doping layer for forming an ohmic electrode by epitaxial growth, the electrode metal which is taken into the crystal ends up freely diffusing without obstruction.

CITATIONS LIST

Non Patent Literature

NPLT 1: Yu. A. Vodakov and E. N. Mokhov, "Silicon Carbide" 1973 (Univ. South Carolina Press, Columbia, 1974, p. 508)

SUMMARY OF INVENTION

Technical Problem

The present invention has as its object the provision of a method of production of an SiC semiconductor device which can form an ohmic electrode while preventing electrode metal from diffusing to the inside of the SiC single crystal substrate.

Solution to Problem

To achieve the above object, according to the present invention, there is provided a method of production of an SiC semiconductor device which includes a step of forming an ohmic electrode on an SiC substrate, characterized by forming a gettering layer with a defect density higher than the SiC substrate on that substrate to be parallel with the substrate surface, then forming the ohmic electrode from the gettering layer outward from the substrate.

Advantageous Effects of Invention

According to the present invention, a gettering layer with a higher density of defects than the SiC substrate is formed from that in parallel on the substrate surface, then an ohmic electrode is formed from the gettering layer outward from the substrate, so even if electrode metal diffuses from the ohmic electrode, it is trapped and immobilized by the gettering layer, so further diffusion to the inside of the SiC substrate does not occur.

BRIEF DESCRIPTION OF DRAWINGS

FIGS. 1A and 1B are cross-sectional views of an SiC substrate in a treatment process of (A) a conventional method (FIG. 1A) and (B) a method of the present invention (FIG. 1B).

DESCRIPTION OF EMBODIMENTS

In FIGS. 1A and 1B, a typical embodiment of the present invention will be explained in comparison with the conventional method. FIGS. 1A and 1B show cross-sectional views of an SiC substrate in the process of treatment of (A) the conventional method (FIG. 1A) and (B) the method of the present invention (FIG. 1B).

In the conventional method (A), (1) an SiC substrate S is formed with (2) a high concentration doped layer D of an impurity (n+ layer or p+ layer), then formed on top of that with (3) electrode metal E deposited by vapor deposition etc., then heat treated for alloying (800 to 1000° C. or so). During this heat treatment, the electrode metal E diffuses into the high concentration doped layer D and further diffuses to the substrate S.

As opposed to this, in the present invention method (B), the procedure is similar to the conventional method up to (1) the SiC substrate S being formed with (2) the high concentration doped layer D of an impurity, however, when forming the ohmic electrode E on that, the procedure is as follows. That is, first (3) a gettering layer G with a higher defect density than the high concentration doped layer D is formed from that surface to be parallel with the substrate surface (upper surface U or reverse surface R), (4) an electrode metal layer E for ohmic electrode use is formed on this gettering layer G (that is, from the gettering layer G outward from the substrate S), then heat treatment is performed for alloying. At the time of heat treatment, diffusion of the electrode metal is inhibited by the gettering layer.

Figure 2A:
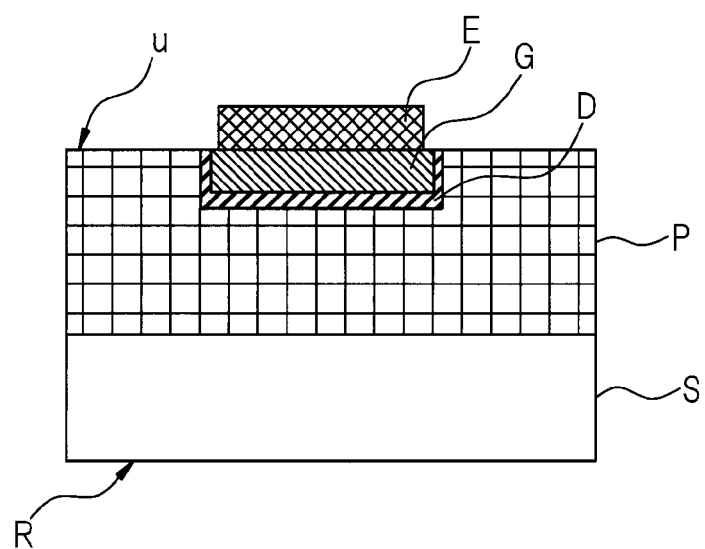
FIGS. 2A and 2B give (A) a cross-sectional view in the case of forming an SiC epitaxial layer on an SiC substrate, forming a high concentration doped layer on that, and further forming an ohmic electrode (FIG. 2A) and (B) a cross-sectional view of the structure when forming an SiC epitaxial layer on an SiC semiconductor substrate, forming a Schottky electrode on that, and providing an ohmic electrode E on a reverse surface of the substrate S (FIG. 2B).

When, as shown in FIG. 2A, the SiC substrate S is formed with a SiC epitaxial layer P, this epitaxial layer is formed with a high concentration doped layer D of P, and further an ohmic electrode E is formed, the gettering effect is particularly large. This is because compared with an SiC substrate S, the coefficient of diffusion of P in an SiC epitaxial layer is larger.

The gettering layer G can be formed by ion implantation. The ion species which is injected is preferably a rare gas, dopant impurity (for the n+ region, a Group V element, while for the p+ region, a Group IV element), Si, C, or other ion species with little effect on the conductivity of the implanted part. When using a dopant impurity, this is doped to a further higher concentration in the high concentration doped layer designed to form the ohmic electrode so as to form a gettering layer.

The characterizing feature of the present invention is the formation of the gettering layer before formation of the ohmic electrode. The ohmic electrode is formed by deposition of an electrode metal and heat treatment for alloying after that. Due to the presence of the gettering layer, diffusion of the electrode metal to the inside of the SiC substrate during heat treatment can be prevented. From the viewpoint of preventing diffusion of the electrode metal to the inside of the SiC substrate, the annealing and other heat treatment for restoring the crystallinity are preferably performed before the formation of the electrode metal layer.

The effect of inhibition of diffusion by the gettering layer of the present invention is the most remarkable in the case of using Ni as the electrode metal. This is because the coefficient of diffusion of Ni in the SiC single crystal is large.

Figure 2B:
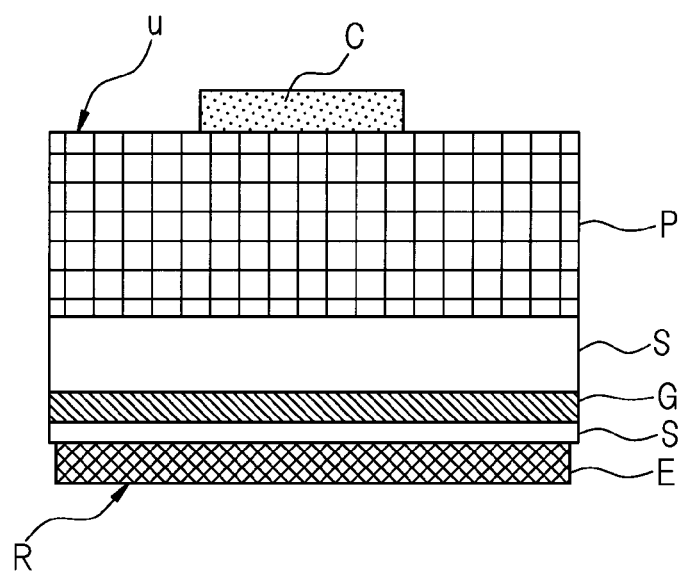

FIG. 2B shows an example of another mode of application of the method of the present invention. The structure which is illustrated is a structure which forms an SiC epitaxial layer on an SiC semiconductor substrate S, forms a Schottky electrode C on top of that, and provides an ohmic electrode E on the reverse surface of the substrate S. When forming the ohmic electrode E, the substrate S is turned upside down, ions are implanted from the reverse surface R of the substrate S to form a gettering layer G in parallel to the substrate surface, and the ohmic electrode E is formed on the reverse surface R (that is, from the gettering layer G outward from the substrate S). Due to this, at the time of heat treatment for alloying the ohmic electrode E, even if the metal of the electrode E diffuses, it is caught and immobilized at the gettering layer whereby it does not diffuse to the inside SiC substrate S.

Furthermore, as another embodiment able to utilize the method of the present invention, in the production of bipolar transistors (BJT) or junction field effect transistors (JFET), when forming the ohmic electrode, it is possible to prevent the metal of the ohmic electrode from diffusing to the inside of the device region of the substrate by forming a gettering layer at the high concentration doped layer in the region right below the electrode. Normally, in these devices, it is seldom that an epitaxial layer is used to form a high concentration doped layer and ions of a dopant element are injected, so the injected element for forming the gettering layer can be selected without considering overlap with the dopant element.

EXAMPLES

The following experiments were used to confirm the effect of the present invention.

Comparative Example 1

The conventional method was used to deposit Ni on the upper surface of an epitaxial growth layer on the SiC single crystal substrate by vapor deposition to 80 nm, then perform heat treatment at 1000° C.×30 minutes.

Figure 3:
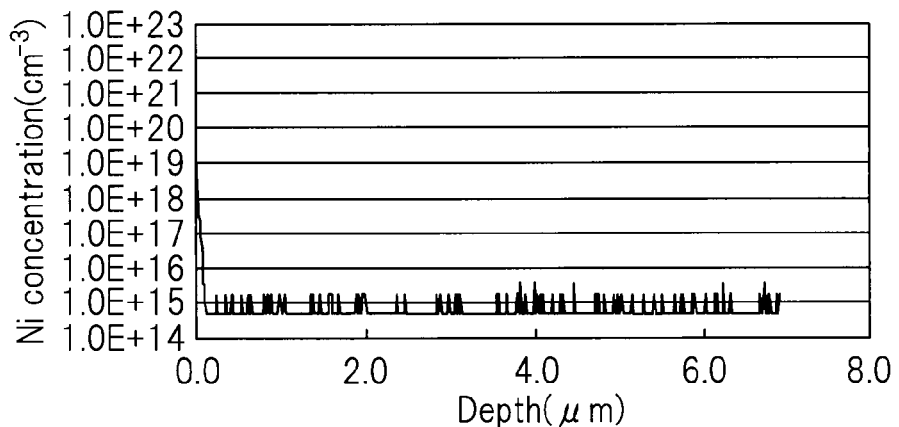
FIG. 3 shows a depth direction profile of an Ni density of the case of using a conventional method to deposit Ni on an upper surface of an epitaxial growth layer on an SiC single crystal substrate by vapor deposition to 80 nm and performing heat treatment at 1000° C.×30 minutes.

FIG. 3 shows a depth direction profile of the Ni density after heat treatment. As shown in the figure, inside of the epitaxial layer, Ni is not detected. This is because the Ni which is taken into the SiC single crystal of the epitaxial layer immediately diffuses and disperses into the crystal and is diluted.

Comparative Example 2

The conventional method was used to deposit Ni on the upper surface of an n type conductivity SiC single crystal substrate by vapor deposition to 80 nm, then perform heat treatment at 1000° C.×30 minutes.

Figure 4:
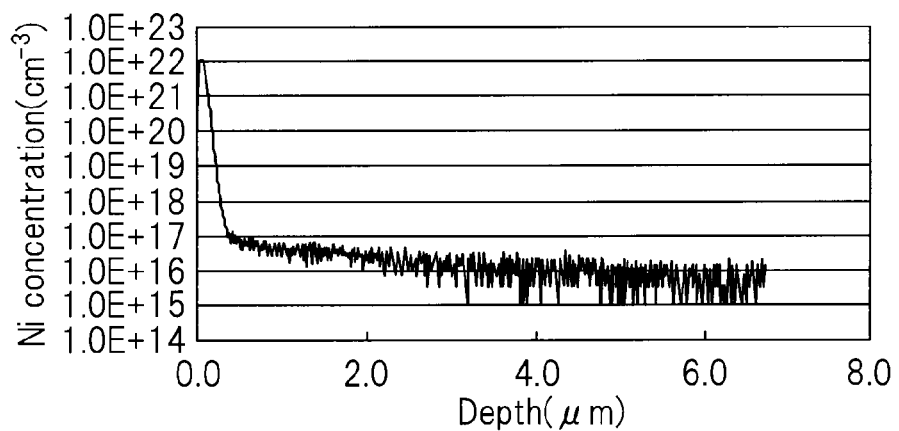
FIG. 4 shows a depth direction profile of an Ni density of the case of using a conventional method to deposit Ni on an upper surface of an n-type conductivity SiC single crystal substrate by vapor deposition to 80 nm and performing heat treatment at 1000° C.×30 minutes.

FIG. 4 shows a depth direction profile of Ni density after heat treatment. As shown in the figure, compared with diffusion into the epitaxial layer of Comparative Example 1, it is understood that the SiC substrate itself has a small coefficient of diffusion, so Ni is trapped from the upper surface while diffusing to the inside of the substrate. If the substrate is thin and the heat treatment time is long, this diffused Ni is liable to reach the device region at the reverse surface of the substrate.

Example 1

According to the present invention method, H+ was injected into the epitaxial growth layer of the SiC single crystal substrate (energy 350 keV, injected dose $1.9 \times 10^{15}$ cm$^{-2}$) to intentionally introduce defects, then Ni was deposited on the upper surface by vapor deposition to Ni to 80 nm and the surface was heat treated at 1000° C.×30 minutes.

Figure 5:
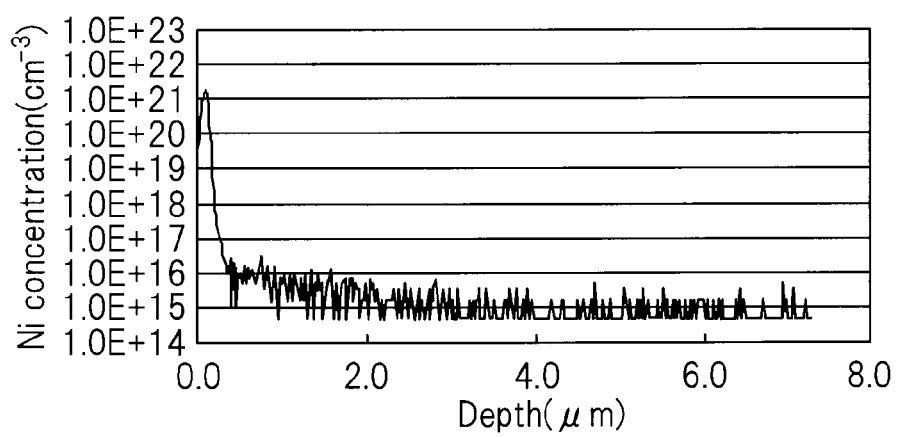
FIG. 5 shows a depth direction profile of an Ni density of the case of using the method of the present invention to inject H+ (energy 350 keV, injection dosage $1.9 \times 10^{15}$ cm$^{-2}$) in an epitaxial growth layer of an SiC single crystal substrate to intentionally introduce defects, then depositing Ni on the surface by vapor deposition to 80 nm and performing heat treatment at 1000° C.×30 minutes.

FIG. 5 shows a depth direction profile of Ni density after heat treatment. As shown in the figure, it is learned that Ni is gettered (trapped and immobilized) inside of the epitaxial layer and is kept from diffusing. However, the amount of introduction of defects was not sufficient, so diffusion of Ni cannot be completely inhibited.

Example 2

According to the method of the present invention, Ni was injected into the epitaxial growth layer of the SiC single crystal substrate (density $1\times10^{17}$ cm$^{-3}$, depth 400 nm), then He ions were injected into the sample (energy 350 keV, injected dose $1.6\times10^{16}$ cm$^{-2}$) to intentionally introduce defects, then the surface was heat treated at 1780° C.×30 minutes.

Figure 6:
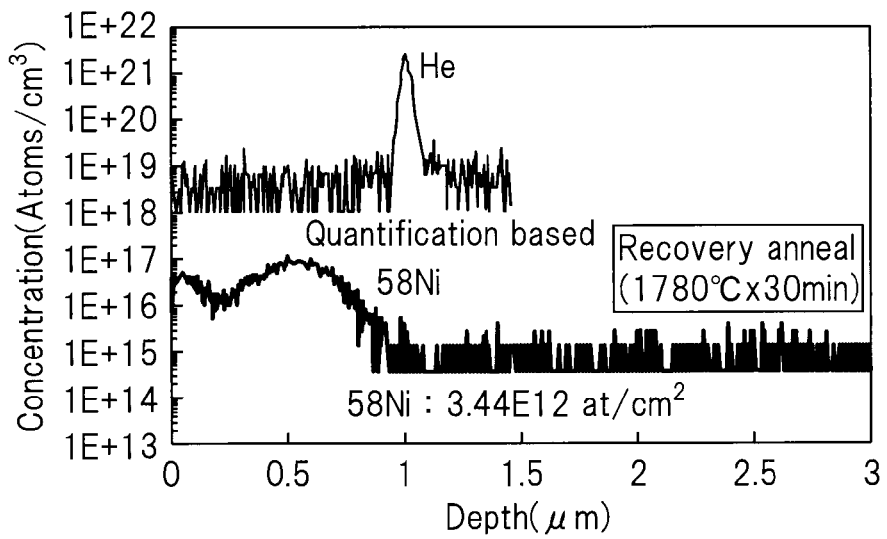
FIG. 6 shows a depth direction profile of an Ni density of the case of using the method of the present invention to inject Ni ions (density $1 \times 10^{17}$ cm$^{-3}$, depth 400 nm), then inject He ions (energy 350 keV, injection dosage $1.6 \times 10^{16}$ cm$^{-2}$) in an epitaxial growth layer of an SiC single crystal substrate to intentionally introduce defects, then performing heat treatment at 1780° C.×30 minutes.

FIG. 6 shows a depth direction profile of Ni density after heat treatment. It is learned that even if performing ultrahigh temperature heat treatment of 1780° C., a peak of the He density, that is, diffusion of Ni is inhibited by the gettering layer.

Similar experiments were performed for Ti, Cr, and Fe instead of Ni.

Figure 7:
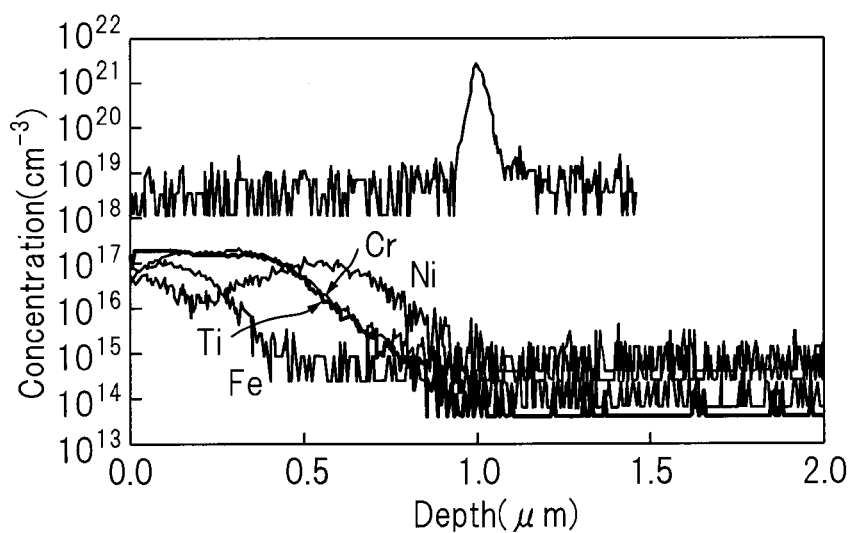
FIG. 7 shows profiles of the Ti density, Cr density, and Fe density together with the profile of the Ni density when performing similar experiments as with FIG. 6 for Ti, Cr, and Fe instead of Ni.

FIG. 7 shows the profiles of the Ti density, Cr density, and Fe density after heat treatment together with the profile of the Ni density. It is learned that diffusion is inhibited by the gettering layer of the present invention for the metals other than Ni.

INDUSTRIAL APPLICABILITY

According to the present invention, there is provided a method of production of an SiC semiconductor device which can form an ohmic electrode while preventing an electrode metal from diffusing inside of an SiC single crystal substrate.

REFERENCE SIGNS LIST

S: SiC single crystal substrate
U: substrate upper surface (substrate surface)
R: substrate reverse surface (substrate surface)
P: epitaxial layer
D: high concentration doped layer
G: gettering layer
E: ohmic electrode (electrode metal layer for ohmic electrode)
C: Schottky electrode

The invention claimed is:

1. A method of production of an SiC semiconductor device, comprising:
    forming a gettering layer in an SiC layer by implanting, into a region of the SiC layer, ions having little effect on a conductivity of the region of the SiC layer, the gettering layer having a defect density higher than a defect density of the SiC layer and being parallel to a surface of the SiC layer, wherein the ions are selected from a group consisting of Si, C, H, and a rare gas; and
    forming an ohmic electrode on the gettering layer.

2. A method of production of an SiC semiconductor device as set forth in claim 1, wherein the SiC layer includes an SiC epitaxial layer formed on an SiC substrate.

3. A method of production of an SiC semiconductor device as set forth in claim 1, wherein forming the ohmic electrode includes forming the ohmic electrode from Ni.

* * * * *